United States Patent [19]

Bult et al.

[11] Patent Number: 5,039,954
[45] Date of Patent: Aug. 13, 1991

[54] AMPLIFIER ARRANGEMENT

[75] Inventors: Klaas Bult; Godefridus J. G. M. Geelen, both of Eindhoven, Netherlands

[73] Assignee: U.S. Philips Corporation, New York, N.Y.

[21] Appl. No.: 519,521

[22] Filed: May 4, 1990

[30] Foreign Application Priority Data

May 8, 1989 [NL] Netherlands .......................... 8901146
Feb. 12, 1990 [NL] Netherlands .......................... 9000326

[51] Int. Cl.$^5$ .............................................. H03F 3/16
[52] U.S. Cl. .................................. 330/277; 330/311
[58] Field of Search ............... 330/253, 257, 277, 296, 330/311

[56] References Cited

U.S. PATENT DOCUMENTS 4,697,153 9/1987 Lish ...................................... 330/277
4,739,282 4/1988 Scheinberg ........................ 330/277

FOREIGN PATENT DOCUMENTS 59-12603 1/1984 Japan .

OTHER PUBLICATIONS

Rehman, M. A., "MOSFET Analog ICs Part 3", Electronic Engineering, vol. 53, No. 647, Jan. 1981, pp. 59, 63-65.

Primary Examiner—Steven Mottola
Attorney, Agent, or Firm—Bernard Franzblau

[57] ABSTRACT

The gain of a cascode amplifier arrangement comprising a first transistor (N1), a second transistor (N2), a current source (J1), an input terminal (1) and an output terminal (3) is increased by adding an amplifier (A) having a non-inverting input (v1), an inverting input (v2) and an output (v0), which are coupled to a reference voltage terminal (2), to the mutually coupled electrodes of the first transistor (N1) and the second transistor (N2), and to the control electrode of the second transistor (N2) respectively. As a result the gain of the arrangement is higher and without a reduction of the unity-gain-bandwidth.

24 Claims, 6 Drawing Sheets

AMPLIFIER ARRANGEMENT

BACKGROUND OF THE INVENTION

This invention relates to an amplifier arrangement for amplifying an input signal, the arrangement comprising a first transistor having a control electrode coupled to an input terminal for receiving the input signal, having a first main electrode coupled to a first supply-voltage terminal, and having a second main electrode, and a second transistor having a control electrode, having a first main electrode coupled to the second main electrode of the first transistor, and having a second main electrode coupled both to a second supply-voltage terminal via a first current source and to an output terminal for supplying an output signal.

In general, such an amplifier arrangement can be used for amplifying a voltage in integrated semiconductor circuits.

Such a cascode amplifier arrangement is known, inter alia, from the book "CMOS analog circuit design" by P. E. Allen and D. R. Holberg, published in 1987. FIG. 6.3-1 on page 288 of this book shows a cascode amplifier arrangement in which the control electrode of the second transistor is coupled to a reference voltage terminal in order to receive a reference voltage. In the known cascode amplifier arrangement the first transistor converts the input voltage, which is applied via the input terminal, into a current which is proportional to the input voltage and which produces potential variations on the first main electrode of the second transistor. These variations, amplified by the gain factor of the second transistor, appear on the output of the arrangement. The overall gain is therefore equal to the product of the gain factors of the first and the second transistor. Consequently, the second transistor makes the gain of the arrangement higher than that of an amplifier arrangement comprising one transistor. This also results in an increased output impedance. In order to achieve a large unity-gain-bandwidth by means of the prior art cascode amplifier arrangement, large bias currents and transistors having a very short channel length are needed. However, this results in the output impedance and hence the gain being reduced substantially. Consequently, the prior-art arrangement is not capable of providing both a large unity-gain-bandwidth and a high gain.

SUMMARY OF THE INVENTION

Therefore, it is an object of the invention to provide an amplifier arrangement for amplifying an input signal, which arrangement has both a high gain and a large unity-gain-bandwidth.

In accordance with the invention an amplifier arrangement is characterized in that the control electrode of the second transistor is coupled to an output of an amplifier, in that the second main electrode of the first transistor is coupled to an inverting input of the amplifier and in that a first reference-voltage terminal for a first reference voltage is coupled to a non-inverting input of the amplifier.

The invention is based on the recognition of the fact that the potential of the first main electrode of the second transistor is maintained substantially constant by the use of the amplifier. This is achieved by negative feedback of the potential variations on said electrode to the control electrode of the second transistor via the amplifier. This causes the gain of the amplifier arrangement to increase by the gain of said amplifier without the unity-gain-bandwidth being adversely affected. An additional advantage is that the amplifier need not have a large bandwidth. As a result of this, the amplifier can be of simple construction and can be integrated on a small surface area.

An amplifier arrangement in accordance with the invention, in which the first transistor and the second transistor together are capable of realising a gain with a frequency response characteristic having a first pole situated at a first frequency and a second pole situated at a second frequency, the first frequency being lower than the second frequency, may be characterized further in that the amplifier is adapted to realise an additional gain with a frequency response characteristic having a unity-gain-bandwidth with a frequency smaller than the second frequency.

Such an amplifier arrangement, in which the dimensioning of the components used in the amplifier and the bias currents through these components dictate the frequency response characteristic and hence the unity-gain bandwidth of the amplifier, has the advantage that it is less susceptible to instability. This instability results from the influence of parasitic capacitances at comparatively high frequencies. At these frequencies the capacitances give rise to a phase shift which in the case of a loop gain in excess of unity render the loop comprising the second transistor and the amplifier unstable, resulting in instability of the entire amplifier arrangement.

A first embodiment of an amplifier arrangement in accordance with the invention may be characterized in that the amplifier comprises a third transistor having a control electrode coupled to the inverting input of the amplifier, having a first main electrode coupled to the non-inverting input of the amplifier, and having a second main electrode coupled both to the output of the amplifier and, by means of a second current source, to the second supplyvoltage terminal. In this simplest embodiment of the amplifier, the third transistor provides the negative feedback from the first main electrode of the second transistor to its control electrode. In this way the potential of the first main electrode of the second transistor is substantially stabilized and the overall gain is increased by the gain factor of the third transistor.

A second embodiment of an amplifier arrangement in accordance with the invention may be characterized in that the control electrode of the third transistor is coupled to the inverting input of the amplifier by means of a level-shifting circuit, and with respect to the level shifting circuit it may be characterized further in that the level-shifting circuit comprises a fourth transistor having a control electrode coupled to the inverting input of the amplifier, having a first main electrode coupled both to the second supplyvoltage terminal by means of a third current source and to the control electrode of the third transistor, and having a second main electrode coupled to the first supplyvoltage terminal. The level shifting circuit provides a lower potential on the first main electrode of the second transistor than in the first embodiment, so that the output voltage swing of the arrangement can be larger. This is of particular importance in the case of low supply voltages.

A third embodiment of an amplifier arrangement in accordance with the invention may be characterized in that, in order to increase its gain factor, the amplifier further comprises a ladder network having a first, a second, a third and a fourth terminal, the first and the second terminal being coupled to the inverting input of the amplifier and the first main electrode of the second transistor, respectively, and the third and the fourth terminal being coupled to the second main electrode of the third transistor and the output of the amplifier respectively, and with respect to the ladder network it may be characterized further in that the ladder network comprises a plurality of cascoded ladder elements, each having a first, a second, a third an a fourth terminal, the first and the second terminal of a ladder element being coupled respectively to the third and the fourth terminal of a preceding ladder element, the first and the second terminal of a first ladder element being coupled respectively to the first and the third terminal of the ladder network, and the third and the fourth terminal of a last ladder element being coupled respectively to the second and the fourth terminal of the ladder network, which ladder elements may each comprise a fourth and a fifth transistor, each having a control electrode, a first main electrode and a second main electrode, the fourth transistor having its control electrode coupled to the second terminal of the ladder element, having its first main electrode coupled to the first terminal of the ladder element and having its second main electrode coupled to the third terminal of the ladder element, and the fifth transistor having its control electrode coupled to the third terminal of the ladder element, having its first main electrode coupled to the second terminal of the ladder element, and having its second main electrode coupled to the fourth terminal of the ladder element. The addition of each ladder element leads to an increase in the gain of the arrangement so that a very high gain can be attained. This is because every transistor in a ladder element provides an amplification of the voltage on its first main electrode to the voltage on its second main electrode, so that the overall gain increases by the gain factor of said transistor.

A fourth embodiment of an amplifier arrangement in accordance with the invention may be characterized in that, in order to increase the gain factor, the amplifier further comprises a ladder network having a first, a second, a third and a fourth terminal, the first and the second terminal being coupled to the second main electrode of the third transistor and the output of the amplifier, respectively, and the third and the fourth terminal being coupled to the first and the second supply-voltage terminal respectively, and with respect to the ladder network it may be characterized further in that the ladder network comprises a plurality of cascaded ladder elements each having a first, a second, a third, a fourth, a fifth and a sixth terminal, the first and the second terminal of a ladder element being coupled respectively to the fifth and the sixth terminal of a preceding ladder element, the third and the fourth terminal of a ladder element being coupled respectively to the third and the fourth terminal of the ladder network, the first and the second terminal of a first ladder element being coupled respectively to the first and the second terminal of the ladder network, and the fifth and the sixth terminal of a last ladder element being coupled to each other, which ladder elements may each comprise a fourth and a fifth transistor, each having a control electrode, a first main electrode and a second main electrode, and a third current source, the fourth transistor having its control electrode coupled to the sixth terminal of the ladder element, which sixth terminal is coupled to the fourth terminal of the ladder element by means of the third current source, having its first main electrode coupled to the first terminal of the ladder element and having its second main electrode coupled to the second terminal of the ladder element, and the fifth transistor having its control electrode coupled to the first terminal of the ladder element, having its first main electrode coupled to the third terminal of the ladder element, and having its second main electrode coupled to the fifth terminal of the ladder element. The addition of each ladder element also leads to an increased overall gain, so that again a very high gain can be obtained. Moreover, in order to achieve a constant voltage swing of the output signal the supply voltage difference need not increase when a ladder element is added. The principle of this ladder network is based on the iterative use of the prior art cascode amplifier arrangement in conjunction with negative feedback of the voltages on the first main electrode and the control electrode of the second transistor in accordance with the invention.

BRIEF DESCRIPTION OF THE DRAWINGS

The invention will now be described in more detail, by way of example, with reference to the accompanying drawings, in which.

DESCRIPTION OF THE PREFERRED EMBODIMENTS

Figure 1:
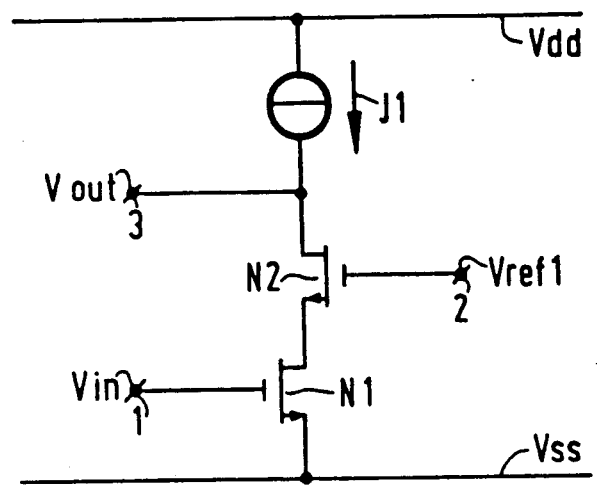
FIG. 1 shows a prior art amplifier arrangement.

FIG. 1 shows a prior art amplifier arrangement. The arrangement comprises a first transistor N1 having its control electrode coupled to an input terminal 1 and having its first main electrode coupled to a first supply voltage terminal Vss, and a second transistor N2 having its control electrode coupled to a first reference-voltage terminal 2, having its first main electrode coupled to the second main electrode of the transistor N1, and having its second main electrode coupled both to the second supply voltage terminal Vdd via a first current source J1 and to an output terminal 3. The input voltage Vin is applied to the input terminal 1 and the reference voltage Vref1 is applied to the reference voltage terminal 2. The output voltage Vout appears on the output terminal 3. The transistor N1 converts the input voltage Vin into a proportional current, which produces potential variations on the first main electrode of the transistor N2. These variations appear on the output of the amplifier arrangement, amplified by the gain factor of the transistor N2. In order to obtain an arrangement having a large gain-bandwidth product, the transistors N1 and N2 should both have a short channel and carry a large current. However, this limits the output impedance and hence the gain of the arrangement. Therefore, in the case of a high gain the unity-gain-bandwidth will be small.

Figure 2:
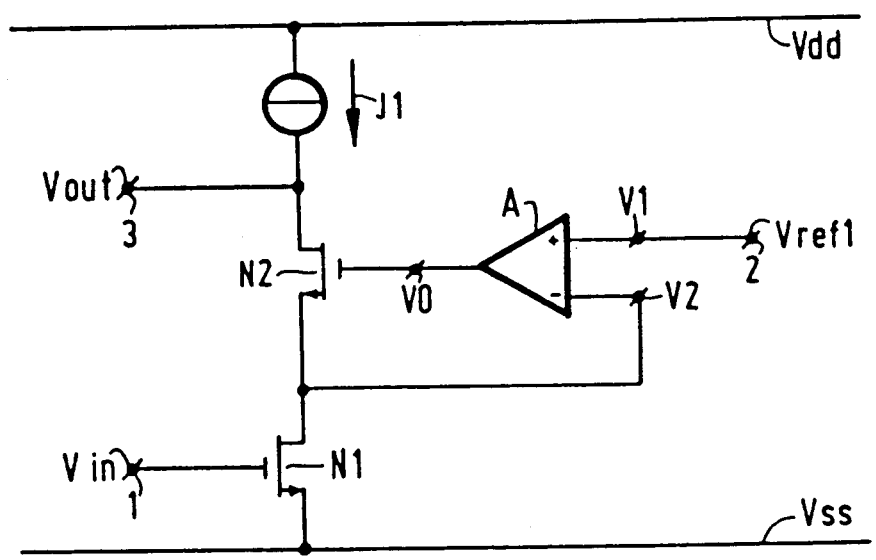
FIG. 2 is a circuit diagram of an amplifier arrangement in accordance with the invention.

FIG. 2 is a circuit diagram of an amplifier arrangement in accordance with the invention, in which like parts bear the same reference numerals as in FIG. 1. In this arrangement the control electrode of the transistor N2 is coupled to the output v0 of an amplifier A, whose non-inverting input v1 is coupled to the reference-voltage terminal 2 and whose inverting input v2 is coupled to the first main electrode of the transistor N2. The amplifier A provides negative feedback of the potential on the first main electrode of the transistor N2 to the control electrode of this transistor. In comparison with the prior-art cascode amplifier arrangement, the gain of the arrangement of FIG. 2 is increased by the gain factor of the amplifier A without a reduction of the unity-gain-bandwidth. The gain can now assume any desired value, the addition of the amplifier A always resulting in an improved performance of the amplifier arrangement.

Figure 3:
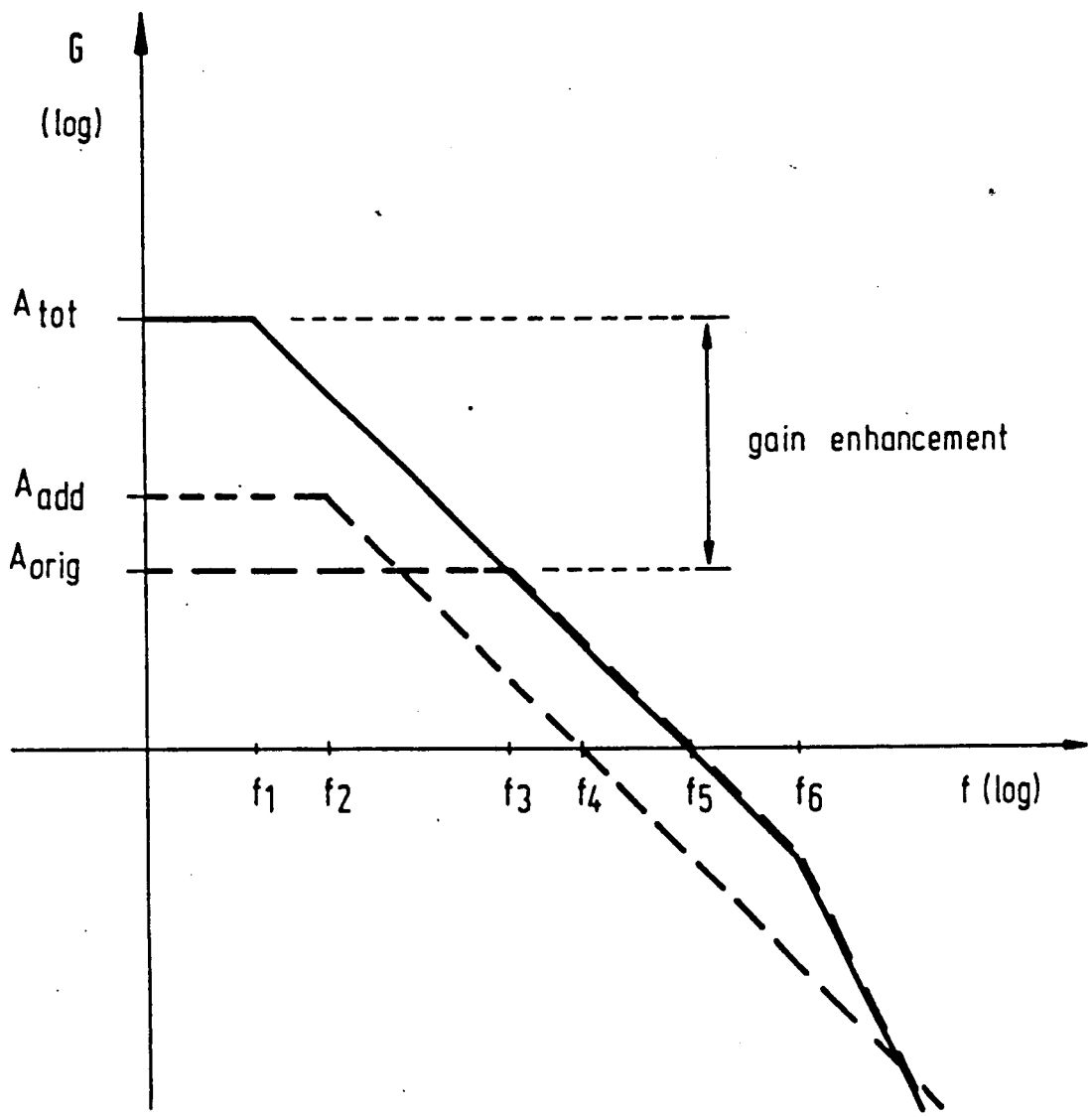
FIG. 3 shows a Bode diagram of the amplifier arrangements shown in FIGS. 1 and 2.

FIG. 3 gives a Bode diagram of the amplifier arrangements shown in FIGS. 1 and 2, the gain G being plotted logarithmically as a function of the frequency f, which is also plotted logarithmically. In this Figure the symbols Aorig, Aadd and Atot respectively represent the direct voltage gain of the prior-art amplifier arrangement, of the amplifier A shown in FIG. 2, and of the amplifier arrangement in accordance with the invention. The frequencies f3, f2 and f1 represent the respective 3-dB frequencies and the frequencies f5, f4 and f5 represent the respective unity-gain-bandwidth frequencies. In addition, the frequency-response characteristics of the amplifier arrangements shown in FIGS. 1 and 2 have a pole situated at a frequency f6. The gain enhancement obtained by the addition of the amplifier A relative to the direct voltage gain Aorig of the prior art amplifier arrangement is indicated by an arrow, which gain enhancement is equal to the direct voltage gain Aadd. If the unity-gain-bandwidth frequency f4 of the amplifier is lower than the pole frequency f6 of the prior-art amplifier arrangement, the amplifier arrangement in accordance with the invention is less susceptible to instability. The dimensioning of the components used in the amplifier and the currents through these components then dictate the frequency-response characteristic and hence the unity-gain bandwidth of the amplifier. For further information on relationships between components and frequency-response characteristics, reference is made to the second edition of the book "Analysis and design of analog integrated circuits" by P. R. Gray and R. G. Meyer, published in 1984. Starting on page 67 this book describes the relationship between transistor dimensions and parasitic capacitances determining the frequency response.

Figure 4:
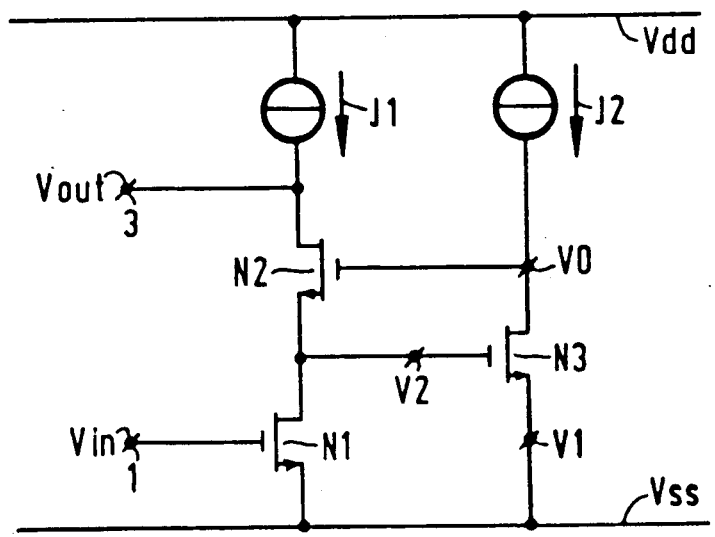
FIG. 4 shows a first embodiment of an amplifier arrangement in accordance with the invention.

FIG. 4 shows a first embodiment of an amplifier arrangement in accordance with the invention, in which like parts bear the same reference numerals as in FIG. 2. In this embodiment the amplifier A comprises a third transistor N3 having its control electrode coupled to the inverting input v2 of the amplifier A, having its first main electrode coupled both to the non-inverting input v1 of the amplifier A and to the supply-voltage terminal Vss, and having its second main electrode coupled both to the supply-voltage terminal Vdd by means of a second current source J2 and to the output v0 of the amplifier A. The transistor N3 provides negative feedback between the first main electrode of the transistor N2 and its control electrode. As a result of the presence of the transistor N3 an increase of the voltage on the first main electrode of the transistor N2 gives rise to a decrease of the voltage on the control electrode of the transistor N2, so that the voltage on the first main electrode of the latter will decrease. This results in negative feedback and hence a stabilisation of the voltage.

Figure 5:
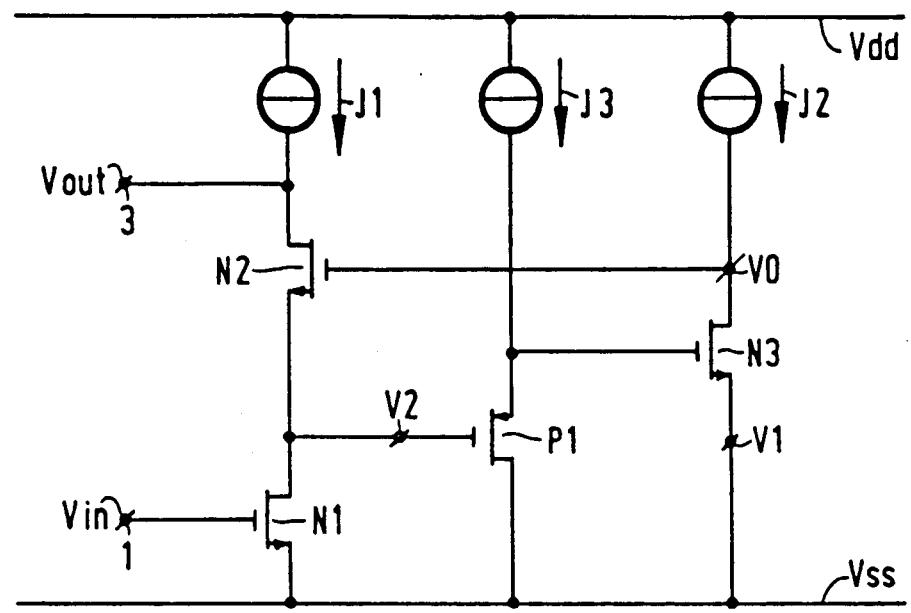
FIG. 5 shows a second embodiment of an amplifier arrangement in accordance with the invention.

FIG. 5 shows a second embodiment of an amplifier arrangement in accordance with the invention, in which like parts bear the same reference numerals as in FIG. 4. The control electrode of the transistor N3 is coupled to the inverting input v2 of the amplifier A by a level-shifting circuit, which comprises a fourth transistor P1 having a control electrode coupled to the inverting input v2 of the amplifier A, having a first main electrode coupled to the supply-voltage terminal Vss, and having a second main electrode coupled both to the supply-voltage terminal Vdd via a third current source J3 and to the control electrode of the transistor N3. Since the transistor P1 is of a conductivity type opposite to that of the other transistors, the voltage on the inverting input v2 of the amplifier A is at least equal to the threshold voltage of the transistor N3 minus the threshold voltage of the transistor P1. Consequently, the output voltage Vout will have a larger maximum voltage swing than the output voltage Vout in the arrangement shown in FIG. 4, where the voltage on the inverting input v2 of the amplifier A is at least equal to the threshold voltage of the transistor N3.

Figure 6:
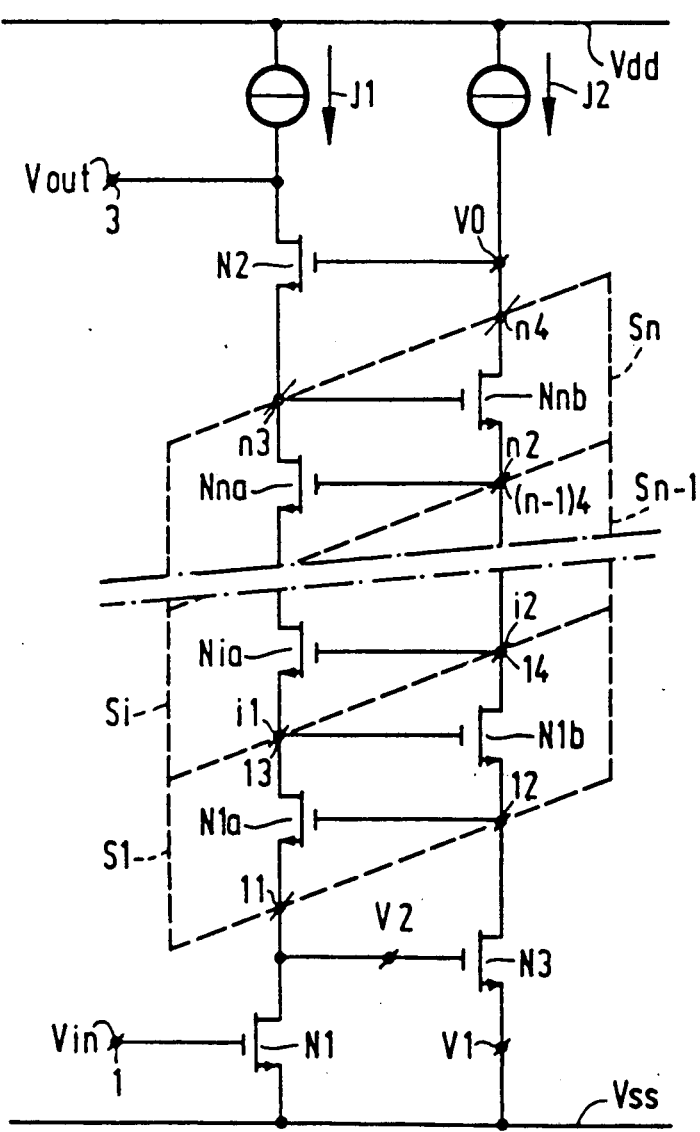
FIG. 6 shows a third embodiment of an amplifier arrangement in accordance with the invention.

FIG. 6 shows a third embodiment of an amplifier arrangement in accordance with the invention, in which like parts bear the same reference numerals as in FIG. 4. In this Figure a ladder network is arranged between the inverting input v2 of the amplifier A and the first main electrode of the transistor N2 on the one hand and the second main electrode of the transistor N3 and the output v0 of the amplifier A on the other hand. The ladder network comprises n cascoded ladder elements Si, each comprising two transistors Nia and Nib, where i is a sequence number smaller than or equal to n. Each ladder element Si has four terminals, the first terminal i1 being coupled to the first main electrode of the transistor Nia, the second terminal i2 being coupled both to the control electrode of the transistor Nia and to the first main electrode of the transistor Nib, the third terminal i3 being coupled both to the second main electrode of the transistor Nia and to the control electrode of the transistor Nib, and the fourth terminal i4 being coupled to the second main electrode of the transistor Nib. Each ladder element Si has its first terminal i1 and its second terminal i2 coupled respectively to the third terminal i3 and to the fourth terminal i4 of a preceding ladder element Si-1, the first and the second terminal i1 and i2 of the first ladder element S1 being coupled to the inverting input v2 of the amplifier A and the second main electrode of the transistor N3 respectively, and the third and the fourth terminal n3 and n4 of the last ladder element Sn being coupled to the first main electrode of the transistor N2 and the output v0 of the amplifier A, respectively. The function of each ladder element Si is to increase the gain of the entire circuit arrangement. To this end each transistor amplifies the voltage on its first main electrode to the voltage on its second main electrode and thus augments the overall gain by its gain factor. Moreover, negative feedback is provided of the potential on the first main electrode of each transistor to its control electrode. For the transistor N1a this is achieved by means of the transistor N3, for the transistor N1b by the transistor Ni1 etc. When this ladder network is used the difference between the two supply voltages Vdd and Vss should be adequate for the number of ladder elements used.

Figure 7:
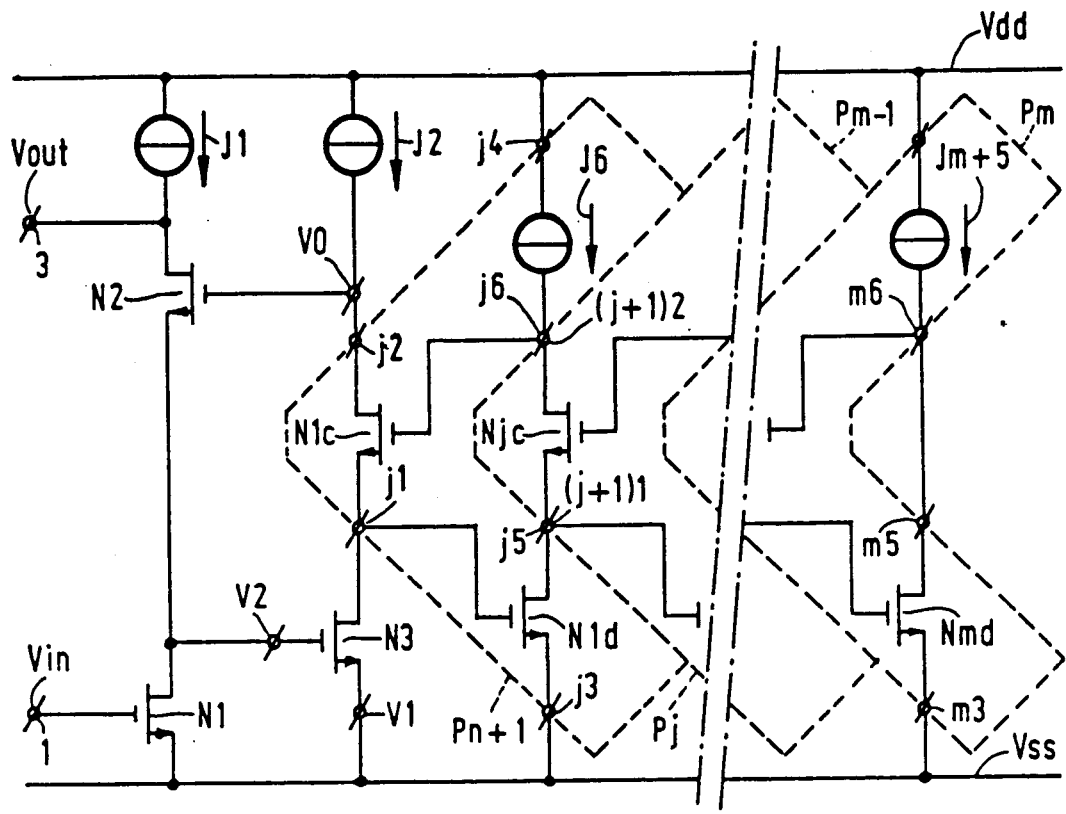
FIG. 7 shows a fourth embodiment of an amplifier arrangement in accordance with the invention.

FIG. 7 shows a fourth embodiment of an amplifier arrangement in accordance with the invention, in which like parts bear the same reference numerals as in FIG. 4. The arrangement also comprises a ladder network in order to increase the gain. The ladder network is coupled between the second main electrode of the transistor N3 and the output v0 of the amplifier on the one hand and the two supply-voltage terminals Vss and Vdd on the other hand. The ladder network comprises m cascoded ladder elements Pj, which each comprise two transistors Njc and Njd and a current source Jj+5, j being a sequence number larger than n and smaller than or equal to n+m. Each ladder element Pj comprises six terminals, the first terminal j1 being coupled to the first main electrode of the transistor Njc and to the control electrode of the transistor Njd, the second terminal j2 being coupled to the second main electrode of the transistor Njc, the third terminal j3 being coupled to the first main electrode of the transistor Njd, the fourth terminal j4 being coupled to the current source Jj+5, the fifth terminal j5 being coupled to the second main electrode of the transistor Njc, and the sixth terminal j6 being coupled both to the control electrode of the transistor Njc and to the current source Jj+5. Each ladder element Pj has its first terminal j1 and its second terminal j2 coupled respectively to the fifth terminal j5 and the sixth terminal j6 of a preceding ladder element Pj−1, the third terminal j3 and the fourth terminal j4 of a ladder element Pj being coupled to the supply/voltage terminals Vss and Vdd respectively, the first terminal j1 and the second terminal j2 of the first ladder element Pn+1 being coupled to the second main electrode of the transistor N3 and the output V0 of the amplifier A respectively, and the fifth terminal j5 and the sixth terminal j6 of the last ladder element Sm being coupled to one another. An advantage of this construction of the ladder network is that the supply-voltage difference need not increase as the number of network elements Sj increases. Each additional ladder element Sj provides both cascoding of a transistor in the cascade circuit and negative feedback of the potential on the first main electrode of the transistor Njc by means of a transistor Njd. This results in an increased gain of the arrangement and it enables any desired value to be obtained by changing the number of ladder elements.

Figure 8:
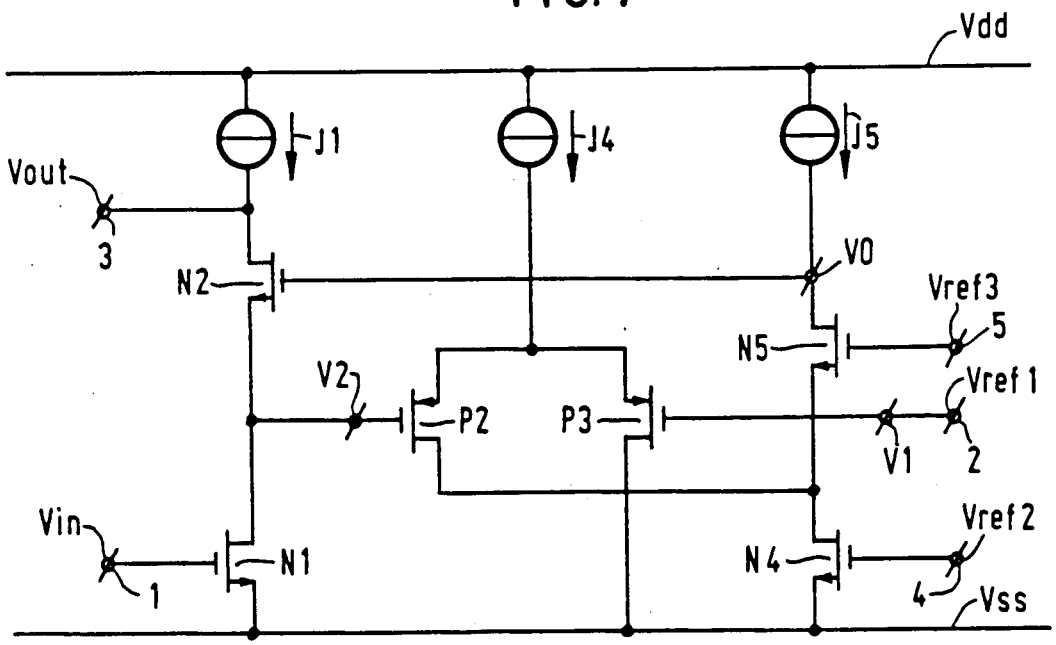
FIG. 8 shows a fifth embodiment of an amplifier arrangement in accordance with the invention.

FIG. 8 shows a fifth embodiment of an amplifier arrangement in accordance with the invention, in which like parts bear the same reference numerals as in FIG. 2. In this arrangement the amplifier A is formed by means of a folded cascode circuit employing a third, a fourth, a fifth and a sixth transistor P2, P3, N4 and N5, a second current source J4 and a third current source J5, a second reference voltage terminal 4 and a third reference voltage terminal 5 for applying the reference voltages Vref2 and Vref3, respectively. The transistor P2 is coupled to the inverting input v2 of the amplifier A via its control electrode and to the second supply/voltage terminal Vdd by means of the current source J4 via its first main electrode. The transistor P3 has its control electrode coupled both to the non-inverting input v1 of the amplifier A and to the reference/voltage terminal 2 for the reference voltage Vref1. The transistor P3 also has its first main electrode coupled to the first main electrode of the third transistor P2 and has its second main electrode coupled to the first supply/voltage terminal Vss. The transistor N4 is coupled to the reference/voltage terminal 4 for the reference voltage Vref2 via its control electrode and to the first supply/voltage terminal Vss via its first main electrode. The transistor N5 is coupled to the reference voltage terminal 5 for the reference voltage Vref3 via its control electrode, to the second main electrodes of both the transistor P2 and the transistor N4 via its first main electrode, and to the second supply-voltage terminal Vdd via the current source J5 and to the output v0 of the amplifier A via its second main electrode. The transistors P2 and P3 are both of a conductivity type opposite to that of the other transistors and together constitute a differential pair. Consequently, the signal on the inverting input V2 of the amplifier A is amplified to the second main electrode of the transistor N4, after which the transistor N4 again amplifies the signal to the output v0 of the amplifier A. This arrangement also has the advantage that the output voltage swing can be comparatively large because in the balanced state the voltage on the inverting input V2 of the amplifier A is dictated by the reference voltage Vref1.

Figure 9:
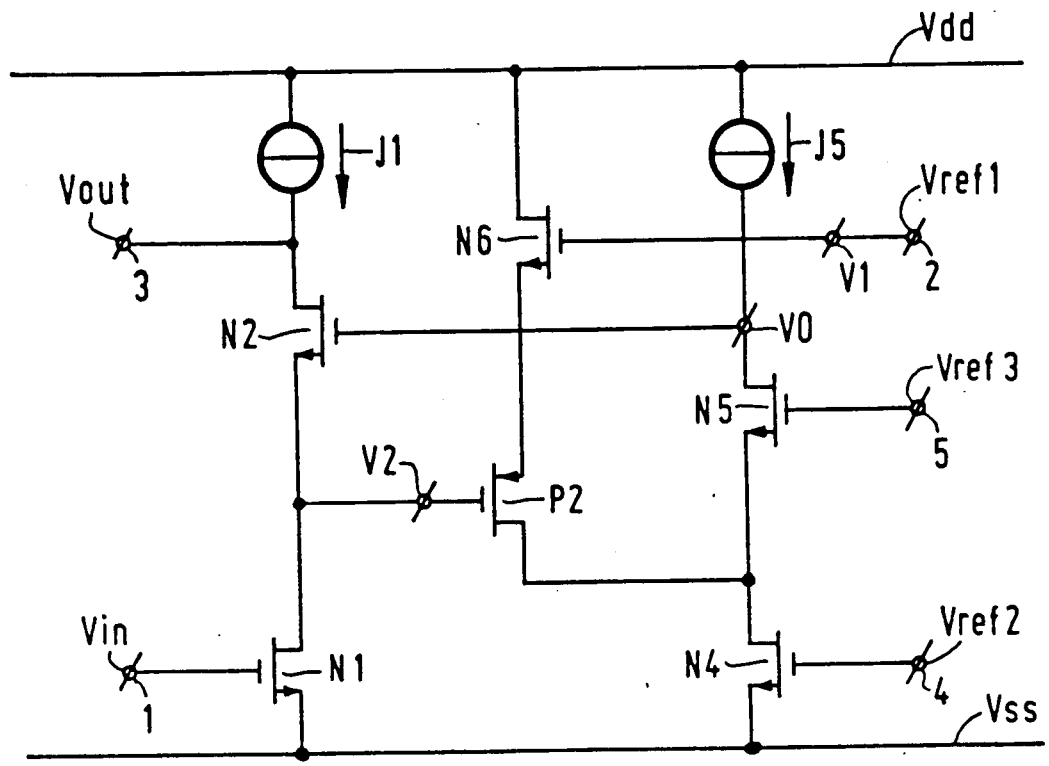
FIG. 9 shows a sixth embodiment of an amplifier arrangement in accordance with the invention.

FIG. 9 shows a sixth embodiment of an amplifier arrangement in accordance with the invention in which like parts bear the same reference numerals as in FIG. 8. In this embodiment, however, the transistor P3 and the current source J4 are replaced by a transistor N6, which has its control electrode coupled both to the non-inverting input v1 of the amplifier A and to the reference-voltage terminal 2 for the reference voltage Vref1. The transistor N6 has its first main electrode coupled to the first main electrode of the transistor P2 and has its second main electrode coupled to the second supply/voltage terminal Vdd. This modification of the circuit arrangement as shown in FIG. 8 has the advantage that the current which was drained via the transistor P3 is saved. In the balanced state the voltage on the inverting input v2 of the amplifier A is equal to the reference voltage Vref1 minus at least the threshold voltage of both the transistor N6 and the transistor P2, so that again a maximum voltage swing on the output 3 is attainable.

Figure 10:
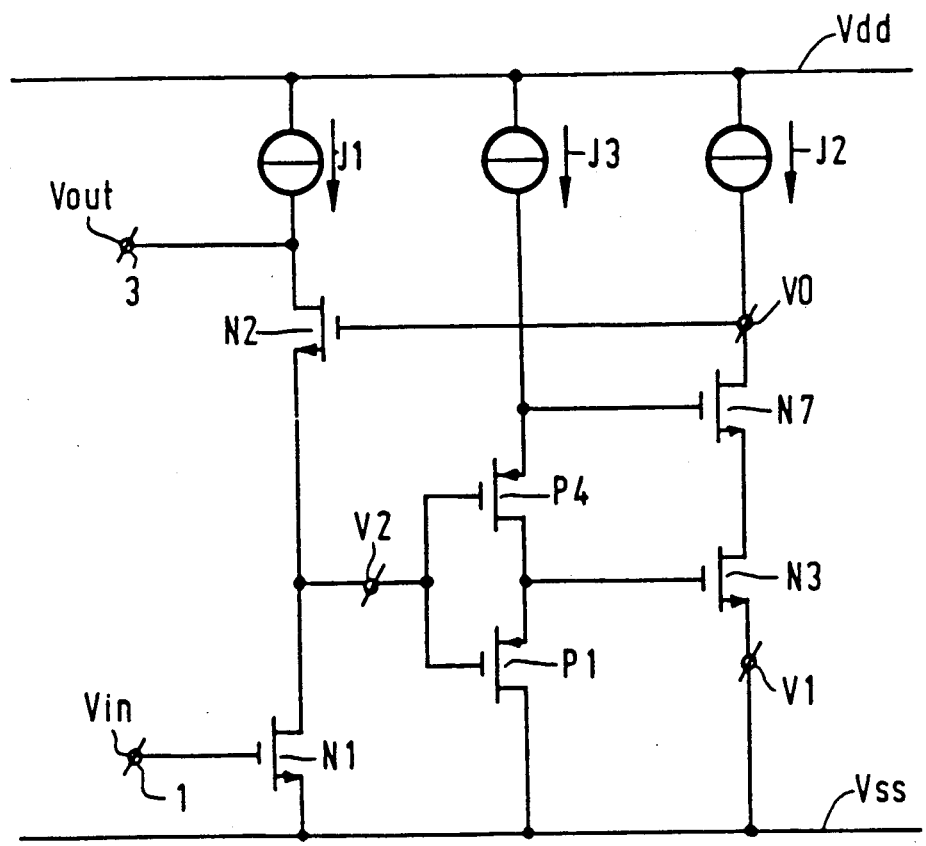
FIG. 10 shows a seventh embodiment of an amplifier arrangement in accordance with the invention.

FIG. 10 shows a seventh embodiment of an amplifier arrangement in accordance with the invention in which like parts bear the same reference numerals as in FIG. 5. Both the transistor P1 and the transistor N3 in this arrangement are cascoded by means of the transistor P4 and the transistor N7, respectively. Thus, the transistor P4 is arranged between the first main electrode of the transistor P1 and the current source J3. The transistor P4 has its control electrode coupled to the inverting input v2 of the amplifier A, its first main electrode coupled to the current source J3 and its second main electrode to the transistor P1. Moreover, the transistor N7 is arranged between the second main electrode of the transistor N3 and the output v0 of the amplifier A and has its control electrode coupled to the first main electrode of the transistor P4, its first main electrode to the second main electrode of the transistor N3 and its second main electrode to the current source J2. This arrangement also enables a comparatively large output voltage swing to be obtained. Cascoding in this way results in an increase in the overall gain, as compared with the arrangement shown in FIG. 5, by the gain factor of the transistor N7. The transistors P1 and P4 are of a conductivity type opposite to that of the other transistors and operate as source followers.

Figure 11:
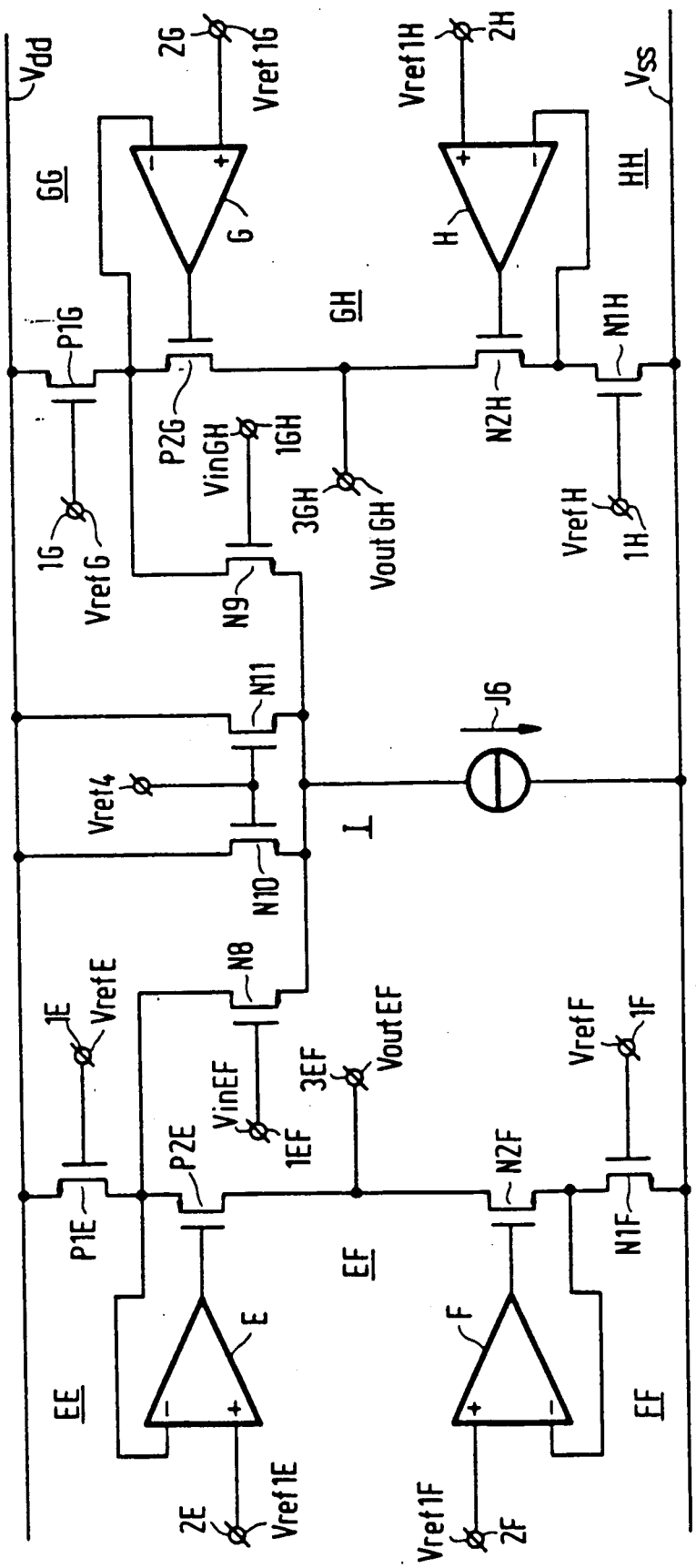
FIG. 11 shows an operational amplifier comprising amplifier arrangements in accordance with the invention.

FIG. 11 shows an operational amplifier comprising amplifier arrangements in accordance with the invention. The operational amplifier comprises a symmetrical input stage I and two mutually similar output stages EF and GH. The input stage I comprises two transistors N8 and N9 arranged as a differential pair and having their mutually coupled first main electrodes coupled both to the supply voltage terminal Vdd by means of a current source J6 and to the supply voltage terminal Vss by two transistors N10 and N11 which are arranged completely in parallel. The first main electrodes of the transistors N10 and N11 are connected to the corresponding electrodes of the transistors N8 and N9, a reference voltage Vref4 being applied to the control electrodes of the transistors N10 and N11. The control electrodes of the transistors N8 and N9 are coupled to a terminal 1EF and a terminal 1GH respectively, the terminal 1EF being arranged to receive an input signal VinEF and the terminal 1GH being arranged to receive an input signal VinGH. The input stage I drives the output stages EF and GH via the second main electrodes of the transistors N8 and N9, which output stages each comprise an amplifier section, EE and GG respectively, and a current-source section, FF and HH respectively. The amplifier section EE comprises a transistor P1E, having its control electrode coupled to a terminal 1E arranged to receive a reference voltage VrefE, having its first main electrode coupled to the supply voltage terminal Vss, and having its second main electrode coupled to an inverting input of an amplifier E, to a first main electrode of a transistor P2E, and to the second main electrode of the transistor N8. The second main electrode of the transistor P2E is coupled to an output terminal 3EF arranged to supply an output signal VoutEF and the control electrode of the transistor P2E is coupled to an output of the amplifier E, which has its non-inverting input coupled to a terminal 2E arranged to receive a reference voltage Vref1E. The current-source section FF comprises a transistor N1F having its control electrode coupled to a terminal 1F arranged to receive a reference voltage VrefF, having its first main electrode coupled to the supply voltage terminal Vdd, and having its second main electrode coupled to an inverting input of an amplifier F and to a first main electrode of a transistor N2F. The second main electrode of the transistor N2F is coupled to the output terminal 3EF and the control electrode of the transistor N2F is coupled to an output of the amplifier F, which has its non-inverting input coupled to a terminal 2F arranged to receive a reference voltage Vref1F. The amplifier section GG comprises a transistor P1G having its control electrode coupled to a terminal 1G arranged to receive a reference voltage VrefG, having its first main electrode coupled to the supply voltage terminal Vss, and having its second main electrode coupled to an inverting input of an amplifier G, to a first main electrode of a transistor P2G and to the second main electrode of the transistor N9. The second main electrode of the transistor P2G is coupled to an output terminal 3GH arranged to supply an output signal VoutGH, and the control electrode of the transistor P2G is coupled to an output of the amplifier G, which has its non-inverting input coupled to a terminal 2G arranged to receive a reference voltage Vref1G. The current-source-section HH comprises a transistor N1H having its control electrode coupled to a terminal 1H arranged to receive a reference voltage VrefH, having its first main electrode coupled to the supply voltage terminal Vdd, and having its second main electrode coupled to an inverting input of an amplifier H and to a first main electrode of a transistor N2H. The second main electrode of the transistor N2H is coupled to the output terminal 3GH and the control electrode of the transistor N2H is coupled to an output of the amplifier H, which has its non-inverting input coupled to a terminal 2H arranged to receive a reference voltage Vref1H.

In the operational amplifier of this construction both the transistors N8 and P2E and the transistors N9 and P2G each constitute a folded cascode pair, the transistors N10 and N11 dictating the voltages on the input terminals 1EF and 1GH depending on the reference voltage Vref4 and the current of the current source J6. As a result of the use of said folded cascode pairs the relevant voltages can be controlled in such a manner that the input signals VinEF and VInGH can each assume a maximum amplitude dictated by the supply voltages. An alternative to the illustrated method of driving the two output stages EF and GH, in which the input stage I is dispensed with, is to apply the respective input signals VinEF and VinGH either to the terminals 1E and 1G or to the terminals 1F and 1H. However, the last-mentioned driving method means that the functions of the output stage sections EF and EF and those of the output stage sections GG and HH are interchanged.

The operational amplifier shown herein thus comprises two output stages operating similarly to the amplifier arrangement shown in FIG. 2, but in which the input signals VinEF and VinGH are each applied via a folded cascode pair, the transistors P1E and P1G merely being codecisive for the bias currents in the amplifier. The amplifiers E, F, G and H can each be implemented in various ways, for example, like one of the amplifier arrangements in the preceding Figures. For an optimum operation of the amplifier arrangements shown in all the Figures, the current sources coupled to the relevant output terminals should have a high impedance in order to obtain a high output impedance and a high gain. The current source sections FF and HH shown in FIG. 11 are exemplary of such current sources.

The scope of the invention is not limited to the embodiments described herein. Within the scope of the invention many variants are conceivable to those skilled in the art. For example, further combinations of cascoding and cascading are possible and amplifiers of different types may be used.

We claim:

1. An amplifier arrangement for amplifying an input signal, the arrangement comprising: a first transistor having control electrode coupled to an input terminal for receiving the input signal, a first main electrode coupled to a first supply-voltage terminal, and a second main electrode, a second transistor having a control electrode, a first main electrode coupled to the second main electrode of the first transistor, and a second main electrode coupled to a second supply-voltage terminal via a first current source and to an output terminal for supplying an output signal, means coupling the control electrode of the second transistor to an output of an amplifier, wherein the second main electrode of the first transistor is coupled to an inverting input of the amplifier, and second means coupling a first reference-voltage terminal for a first reference voltage to a non-inverting input of the amplifier.

2. An amplifier arrangement as claimed in claim 1, wherein the first transistor and the second transistor together are capable of deriving a gain with a frequency response characteristic having a first pole situated at a first frequency and a second pole situated at a second frequency, the first frequency being lower than the second frequency, characterized in that the amplifier is adapted to derive an additional gain with a frequency response characteristic having a unit-gain-bandwidth with a frequency smaller than the second frequency.

3. An amplifier arrangement as claimed in claim 1, wherein the amplifier comprises a third transistor having a control electrode coupled to the inverting input of the amplifier, a first main electrode coupled to the non-inverting input of the amplifier, and a second main electrode coupled both to the output of the amplifier and, by means of a second current source, to the second supply-voltage terminal.

4. An amplifier arrangement as claimed in claim 3, wherein the first reference voltage terminal is coupled to the first supply-voltage terminal.

5. An amplifier arrangement as claimed in claim 3 wherein the control electrode of the third transistor is coupled to the inverting input of the amplifier via a level-shifting circuit.

6. An amplifier arrangement as claimed in claim 5, wherein the level-shifting circuit comprises a fourth transistor having a control electrode coupled to the inverting input of the amplifier, a first main electrode coupled both to the second supply-voltage terminal by means of a third current source and to the control electrode of the third transistor, and a second main electrode coupled to the first supply-voltage terminal.

7. An amplifier arrangement as claimed in claim 3, wherein, in order to increase its gain factor, the amplifier further comprises a ladder network having a first, a second, a third and a fourth terminal, the first and the second terminal being coupled to the inverting input of the amplifier and the first main electrode of the second transistor, respectively, and the third and the fourth terminal being coupled to the second main electrode of the third transistor and the output of the amplifier, respectively.

8. An amplifier arrangement as claimed in claim 7, wherein the ladder network comprises a plurality of cascoded ladder elements, each having a first, a second, a third and a fourth terminal, the first and the second terminal of a ladder element being coupled, respectively, to the third and the fourth terminal of a preceding ladder element, the first and the second terminal of a first ladder element being coupled, respectively, to the first and the third terminal of the ladder network, and the third and the fourth terminal of a last ladder element being coupled, respectively, to the second and the fourth terminal of the ladder network.

9. An amplifier arrangement as claimed in claim 8, wherein each ladder element comprises a fourth and a fifth transistor, each having a control electrode, a first main electrode and a second main electrode, the fourth transistor having its control electrode coupled to the second terminal of the ladder element, its first main electrode coupled to the first terminal of the ladder element, and its second main electrode coupled to the third terminal of the ladder element, and the fifth transistor having its control electrode coupled to the third terminal of the ladder element, its first main electrode coupled to the second terminal of the ladder element, and having its second main electrode coupled to the fourth terminal of the ladder element.

10. An amplifier arrangement as claimed in claim 3, wherein, in order to increase its gain factor, the amplifier further comprises a ladder network having a first, a second, a third and a fourth terminal, the first and the second terminal being coupled to the second main electrode of the third transistor and the output of the amplifier, respectively, and the third and the fourth terminal being coupled to the first and the second supply-voltage terminal, respectively.

11. An amplifier arrangement as claimed in claim 10, wherein the ladder network comprises a plurality of cascaded ladder elements each having a first, a second, a third, a fourth, a fifth and a sixth terminal, the first and the second terminal of a ladder element being coupled respectively to the fifth and the sixth terminal of a preceding ladder element, the third and the fourth terminal of a ladder element being coupled respectively to the third and the fourth terminal of the ladder network, the first and the second terminal of a first ladder element being coupled respectively to the first and the second terminal of the ladder network, and the fifth and the sixth terminal of a last ladder element being coupled to each other.

12. An amplifier arrangement as claimed in claim 11, wherein each ladder element comprises a fourth and a fifth transistor, each having a control electrode, a first main electrode and a second main electrode, and a third current source, the fourth transistor having its control electrode coupled to the sixth terminal of the ladder element, which sixth terminal is coupled to the fourth terminal of the ladder element by means of the third current source, having its first main electrode coupled to the first terminal of the ladder element, and having its second main electrode coupled to the second terminal of the ladder element, and the fifth transistor having its control electrode coupled to the first terminal of the ladder element, having its first main electrode coupled to the third terminal of the ladder element, and having its second main electrode coupled to the fifth terminal of the ladder element.

13. An amplifier arrangement as claimed in claim 10, wherein the ladder network comprises at least one ladder element.

14. An amplifier arrangement as claimed in claim 11, wherein the cascaded ladder elements are coupled by means of level-shifting circuits.

15. An amplifier arrangement as claimed in claim 1, wherein the amplifier further comprises a third transistor having a control electrode coupled to the inverting input of the amplifier, a first main electrode and a second main electrode, a fourth transistor having a control electrode coupled to the non-inverting input of the amplifier, a first main electrode coupled to the first main electrode of the third transistor, and having a second main electrode, a fifth transistor having a control electrode coupled to a second reference-voltage terminal for a second reference voltage, having a first main electrode coupled to the first supply-voltage terminal, and a second main electrode, and a sixth transistor having a control electrode coupled to a third reference voltage terminal for a third reference voltage, a first main electrode coupled to the second main electrode of both the third and the fifth transistor, and having a second main electrode coupled both to the second supply-voltage terminal via a second current source and to the output of the amplifier.

16. An amplifier arrangement as claimed in claim 15, wherein the first main electrode of the fourth transistor is coupled to the second supply-voltage terminal via a third current source and the second main electrode of the fourth transistor is coupled to the first supply-voltage terminal.

17. An amplifier arrangement as claimed in claim 15, wherein the second main electrode of the fourth transistor is coupled to the second supply-voltage terminal.

18. An amplifier arrangement as claimed in claim 1, wherein the first and the second transistor are coupled in accordance with a folded cascode pair, the first main electrode of the first transistor being coupled to the first supply-voltage terminal by means of a voltage reference circuit and the second main electrode of the first transistor being coupled to the first supply-voltage terminal by means of a further transistor.

19. An amplifier arrangement as claimed in claim 2, wherein the amplifier comprises a third transistor having a control electrode coupled to the inverting input of the amplifier, a first main electrode coupled to the non-inverting input of the amplifier, and a second main electrode coupled both to the output of the amplifier and, by means of a second current source, to the second supply-voltage terminal.

20. An amplifier arrangement as claimed in claim 4, wherein the control electrode of the third transistor is coupled to the inverting input of the amplifier via a level-shifting circuit.

21. An amplifier arrangement as claimed in claim 7, wherein the ladder network comprises at least one ladder element.

22. An amplifier arrangement as claimed in claim 2, wherein the amplifier further comprises a third transistor having a control electrode coupled to the inverting input of the amplifier, a first main electrode and a second main electrode, a fourth transistor having a control electrode coupled to the non-inverting input of the amplifier, a first main electrode coupled to the first main electrode of the third transistor, and having a second main electrode, a fifth transistor having a control electrode coupled to a second reference-voltage terminal for a second reference voltage, having a first main electrode coupled to the first supply-voltage terminal, and a second main electrode, and a sixth transistor having a control electrode coupled to a third reference voltage terminal for a third reference voltage, a first main electrode coupled to the second main electrode of both the third and the fifth transistor, and having a second main electrode coupled both to the second supply-voltage terminal via a second current source and to the output of the amplifier.

23. An amplifier arrangement as claimed in claim 2, wherein the first and the second transistor are coupled in accordance with a folded cascode pair, the first main electrode of the first transistor being coupled to the first supply-voltage terminal by means of a voltage reference circuit and the second main electrode of the first transistor being coupled to the first supply-voltage terminal by means of a further transistor.

24. An amplifier arrangement as claimed in claim 1 wherein said first current source has a high impedance.

* * * * *